(12) United States Patent
Lee et al.

(10) Patent No.: US 11,818,945 B2
(45) Date of Patent: Nov. 14, 2023

(54) TRANSPARENT ORGANIC LIGHT EMITTING DISPLAY APPARATUS AND METHOD OF MANUFACTURING THE SAME

(71) Applicant: LG DISPLAY CO., LTD., Seoul (KR)

(72) Inventors: Joonsuk Lee, Paju-si (KR); SeJune Kim, Paju-si (KR); Dohyung Kim, Paju-si (KR); Saemleenuri Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/712,878

(22) Filed: Apr. 4, 2022

(65) Prior Publication Data

US 2022/0231240 A1 Jul. 21, 2022

Related U.S. Application Data

(62) Division of application No. 16/573,045, filed on Sep. 17, 2019, now Pat. No. 11,322,698.

(30) Foreign Application Priority Data

Oct. 31, 2018 (KR) .................. 10-2018-0131996

(51) Int. Cl.
*H10K 77/10* (2023.01)
*H10K 50/844* (2023.01)
(Continued)

(52) U.S. Cl.
CPC ......... *H10K 77/111* (2023.02); *H10K 50/844* (2023.02); *H10K 50/865* (2023.02);
(Continued)

(58) Field of Classification Search
CPC ...... H10K 50/80; H10K 50/805; H10K 50/81; H10K 50/814; H10K 50/816;
(Continued)

(56) References Cited

U.S. PATENT DOCUMENTS

2017/0301892 A1   10/2017   Kwak et al.
2017/0301895 A1   10/2017   Young
(Continued)

FOREIGN PATENT DOCUMENTS

CN           1773720 A      5/2006
CN         105590953 A      5/2016
(Continued)

*Primary Examiner* — Sonya McCall-Shepard
(74) *Attorney, Agent, or Firm* — Birch, Stewart, Kolasch & Birch, LLP

(57) ABSTRACT

A method of manufacturing a transparent organic light emitting display apparatus having an emission area, and a transmission area disposed adjacent to the emission area and configured to pass external light therethrough, includes sequentially forming an interlayer dielectric and a first protection layer on a first substrate, patterning a planarization layer over the first protection layer, forming an organic light emitting device over the planarization layer, forming an encapsulation layer and an encapsulation substrate over the organic light emitting device, and exposing and etching at least some portions of the transmission area by using photolithography after the patterning of the planarization layer.

19 Claims, 17 Drawing Sheets

(51) Int. Cl.
*H10K 50/86* (2023.01)
*H10K 59/124* (2023.01)
*H10K 59/38* (2023.01)
*H10K 71/00* (2023.01)
*H10K 71/20* (2023.01)
*H10K 59/12* (2023.01)
*H10K 102/00* (2023.01)
*H10K 59/122* (2023.01)
*H10K 59/35* (2023.01)
*G09F 9/30* (2006.01)
*H10K 59/121* (2023.01)
*H10K 59/00* (2023.01)
*H10K 50/84* (2023.01)

(52) U.S. Cl.
CPC ........... *H10K 59/124* (2023.02); *H10K 59/38* (2023.02); *H10K 71/00* (2023.02); *H10K 71/233* (2023.02); *H10K 59/1201* (2023.02); *H10K 2102/311* (2023.02)

(58) Field of Classification Search
CPC .... H10K 50/818; H10K 59/80; H10K 59/805; H10K 59/8051; H10K 50/00; H10K 50/10; H10K 50/11; H10K 59/10; H10K 59/12; H10K 59/121; H10K 59/122; H10K 59/124; H10K 50/842; H10K 50/844; H10K 50/8445; H10K 50/84; H10K 50/841; H10K 59/87; H10K 59/871; H10K 59/872; H10K 59/873; H10K 59/8731; H10K 59/1201; H10K 59/19; H10K 59/131; H10K 59/1315; H10K 50/82; H10K 50/822; H10K 50/824; H10K 50/826; H10K 59/8052; H10K 59/80521; H10K 59/80522; H10K 59/80523; H10K 50/846; H10K 59/874; H10K 71/231; H10K 71/233; H10K 71/50; H10K 71/60; H10K 71/621; H10K 10/88; H10K 77/111; H10K 2102/311; H10K 50/865; H10K 59/38; H10K 59/00; H10K 71/00; H10K 59/351; H01L 51/107; H01L 51/5253; H01L 51/5256; H01L 27/32; H01L 27/3225; G09F 9/301; Y02P 70/50; Y02E 10/549
See application file for complete search history.

(56) References Cited

U.S. PATENT DOCUMENTS

| | | | |
|---|---|---|---|
| 2018/0145118 A1* | 5/2018 | Kim | ............ G09G 3/3258 |
| 2018/0166522 A1 | 6/2018 | Kim et al. | |
| 2020/0106045 A1 | 4/2020 | Han et al. | |

FOREIGN PATENT DOCUMENTS

| | | | | | |
|---|---|---|---|---|---|
| CN | 108022953 A | | 5/2018 | | |
| CN | 108023026 A | | 5/2018 | | |
| CN | 108153035 A | | 6/2018 | | |
| CN | 108155299 A | | 6/2018 | | |
| CN | 109212920 A | * | 1/2019 | ........... | G03F 9/7076 |
| KR | 10-2017-0063326 A | | 6/2017 | | |
| KR | 10-2018-0025024 A | | 3/2018 | | |
| KR | 10-2018-0062284 A | | 6/2018 | | |

* cited by examiner

TRANSPARENT ORGANIC LIGHT EMITTING DISPLAY APPARATUS AND METHOD OF MANUFACTURING THE SAME

CROSS-REFERENCE TO RELATED APPLICATIONS

This Application is a Divisional of U.S. patent application Ser. No. 16/573,045 filed on Sep. 17, 2019, which claims the priority benefit of the Korean Patent Application No. 10-2018-0131996 filed on Oct. 31, 2018 in the Republic of Korea, the entire contents of all these applications being hereby expressly incorporated by reference into the present application.

BACKGROUND

Technical Field

The present disclosure relates to a transparent organic light emitting display apparatus and a method of manufacturing the same.

Discussion of the Related Art

A display apparatus is widely used as a display screen of a notebook computer, a tablet computer, a smartphone, a mobile display device, a mobile information device in addition to a display screen of a television or a monitor.

An organic light emitting display is a self light emitting display device, and can be fabricated at a lightweight and slim size as it does not need a separate light source unlike a liquid crystal display (LCD). Also, the organic light emitting display is favorable in view of power consumption due to low voltage driving and also is excellent for color realization, a response speed, a viewing angle, and a contrast ratio (CR), whereby the organic light emitting display has been studied as a display for the next generation.

In order to satisfy a user's various needs, a transparent organic light emitting display apparatus capable of transmitting external light has been explored. The transparent organic light emitting display apparatus includes a plurality of pixels, wherein the pixel includes an emission area configured to display an image by a light emission of an organic light emitting device, and a transmission area configured to pass external light therethrough. A transparency of the transparent organic light emitting display apparatus may be secured by the use of transmission area.

However, an emitting portion of the organic light emitting device is formed of an organic material layer, and the emitting portion has an inferior adhesion strength to other layers formed of inorganic films or metal films. Thus, in the interface between the emitting portion and the other layers of the organic light emitting device, a delamination of the emitting portion frequently occurs by a physical deformation such as an external shock or bending force, to thereby deteriorate durability of the organic light emitting device.

SUMMARY

The present disclosure has been made in view of the above problems and other limitations associated with the related art, and it is an object of the present disclosure to provide a transparent organic light emitting display apparatus with good delamination resistance to a specific layer comprising an emission layer (EL) by a physical deformation such as an external shock or bending force, which is capable of reducing defects which might occur during a manufacturing process, and improving productivity.

In addition to the objects of the present disclosure as mentioned above, additional objects of the present disclosure will be clearly understood by those skilled in the art from the following description of the present disclosure.

In accordance with an aspect of the present disclosure, the above and other objects can be accomplished by the provision of a transparent organic light emitting display apparatus comprising an emission area; a transmission area disposed adjacent to the emission area and configured to pass external light therethrough; and an undercut area formed in the transmission area, wherein the undercut area is formed by filling an encapsulation layer.

In accordance with another aspect of the present disclosure, there is provided a method of manufacturing a transparent organic light emitting display apparatus having an emission area, and a transmission area disposed adjacent to the emission area and configured to pass external light therethrough, comprising sequentially forming an interlayer dielectric and a first protection layer on a first substrate; patterning a planarization layer on the first protection layer; forming an organic light emitting device on the planarization layer; and forming an encapsulation layer and an encapsulation substrate on the organic light emitting device, wherein a step of exposing and etching at least some portions of the transmission area by photolithography is carried out after the step of patterning the planarization layer.

According to one or more embodiments of the present disclosure, the transparent organic light emitting display apparatus includes the undercut area included in the transmission area so that it is possible to provide the transparent organic light emitting display apparatus with good delamination resistance to a specific layer comprising an emission layer (EL) by a physical deformation such as an external shock or bending force.

In addition to the effects of the present disclosure as mentioned above, additional objects of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE DISCLOSURE

Figure 1:
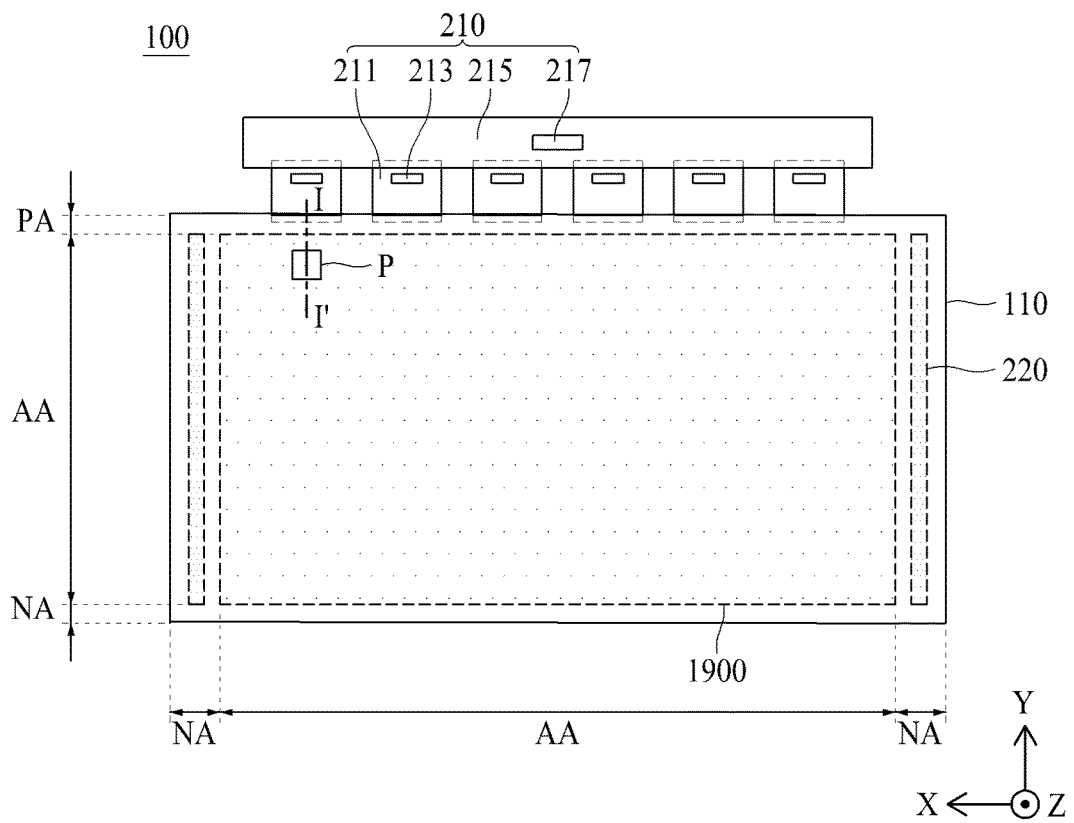
FIG. 1 is a plane view illustrating a transparent organic light emitting display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above~', 'below-', and 'next to-', one or more portions can be arranged between two other portions unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first", "second", etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, a transparent organic light emitting display apparatus and a method of manufacturing the same will be described in detail with reference to the accompanying drawings. In the drawings, the same or similar elements are denoted by the same reference numerals even though they are depicted in different drawings.

FIG. 1 is a plane view illustrating a transparent organic light emitting display apparatus according to one embodiment of the present disclosure. All the components of the transparent organic light emitting display apparatus according to all embodiments of the present disclosure are operatively coupled and configured.

Referring to FIG. 1, a transparent organic light emitting display apparatus 100 includes a substrate 110, a pixel array 1900, a display driving circuit portion 210, and a scan driving circuit portion 220.

The substrate 110 is a base substrate, which can be a flexible substrate. For example, the substrate 110 can include a transparent polyimide material. As the polyimide-based substrate 110 is manufactured at a high-temperature deposition process, good thermal resistance polyimide, which endures a high temperature, can be used for the substrate 110. The polyimide-based substrate 110 can be formed by curing polyimide resin coated at a constant thickness on a front surface of a sacrificial layer prepared in a carrier glass substrate. Herein, the carrier glass substrate can be separated from the substrate 110 by a release of the sacrificial layer for a laser release process. And, the sacrificial layer can be formed of amorphous silicon (a-Si) or silicon nitride (SiN).

According to one embodiment of the present disclosure, the substrate 110 can be a glass substrate. For example, the substrate 110 can include a main component of silicon oxide ($SiO_2$) or aluminum oxide ($Al_2O_3$).

The substrate 110 can include a display area (AA), a non-display area (NA), and a pad area (PA). The display area (AA) is an area for displaying an image thereon, which can be defined as a central area of the substrate 110. Herein, the display area (AA) can correspond to an active area of the pixel array 1900. For example, the display area (AA) can include a plurality of pixels P formed in every pixel area defined by crossing a plurality of gate lines and a plurality of data lines. Herein, each of the plurality of pixels can be defined as a minimum unit configured to emit light.

The non-display area (NA) is an area on which an image is not displayed. The non-display area (NA) and the pad area (PA) can surround the display area (AA). For example, the non-display area (NA) can be defined in the periphery area of the substrate 110 while being configured to surround the display area (AA).

The pad area (PA) can be disposed in one peripheral area of the substrate 110, and a pad electrode of the pad area (PA) can be electrically connected with a flexible circuit film 211 of the display driving circuit portion 210. Accordingly, the transparent organic light emitting display apparatus 100 can receive signal and power from the display driving circuit portion 210 through the pad electrode.

The pixel array 1900 can include a thin film transistor layer and/or an emission device layer. The thin film transistor layer can include a thin film transistor, a gate insulating film, an interlayer dielectric, a protection film, and a planarization layer. And, the emission device layer can include a plurality of organic light emitting devices (e.g., organic light emitting diodes) and a plurality of banks. A detailed structure of the pixel array 1900 will be described later with reference to FIG. 2.

The display driving circuit portion 210 is connected with a pad portion (or pad electrode) prepared in the pad area (PA) of the substrate 110, whereby an image corresponding to video data supplied from a display driving system can be displayed on each pixel. According to one embodiment of the present disclosure, the display driving circuit portion 210 can include a plurality of flexible circuit films 211, a plurality of data driving integrated circuits 213, a printed circuit board 215, and a timing controller 217.

An input terminal prepared in one side in each of the plurality of flexible circuit films 211 is attached to the printed circuit board 215 by a film attachment process, and an output terminal prepared in the other side in each of the plurality of flexible circuit films 211 can be attached to the pad portion (or pad electrode) by the film attachment process. According to one embodiment of the present disclosure, each of the plurality of flexible circuit films 211 can be flexible and bent so as to reduce a bezel area of the transparent organic light emitting display apparatus 100. For example, the plurality of flexible circuit films 211 can be formed of tape carrier package (TCP) or chip on flexible board (COF, or chip on film).

Each of the plurality of data driving integrated circuits 213 can be individually mounted on each of the plurality of flexible circuit films 211. The plurality of data driving integrated circuits 213 can receive pixel data and data control signal from the timing controller 217, can convert the pixel data into an analog data signal for each pixel in accordance with the data control signal, and can supply the analog data signal for each pixel to the corresponding data line.

The printed circuit board 215 can support the timing controller 217, and can transmit the signal and power between elements of the display driving circuit portion 210. The printed circuit board 215 can provide signals and driving power, supplied from the timing controller 217 so as to display an image in each pixel, to the plurality of data driving integrated circuits 213 and the scan driving circuit portion 220. To this end, various signal lines and power source lines can be prepared on the printed circuit board 215. For example, one or more printed circuit boards 215 can be provided on the basis of the number of flexible circuit films 211.

The timing controller 217 is mounted on the printed circuit board 215, and can receive the video data and timing synchronized signal provided from the display driving system through a user connector prepared in the printed circuit board 215. The timing controller 217 can generate pixel data by aligning the video data to be appropriate for a pixel arrangement structure on the basis of the timing synchronized signal, and can provide the generated pixel data to the corresponding data driving integrated circuit 213. And, the timing controller 217 can generate each of the data control signal and scan control signal based on the timing synchronized signal, can control a driving timing in each of the plurality of data driving integrated circuits 213 through the data control signal, and can control a driving timing of the scan driving circuit portion 220 through the scan control signal. Herein, the scan control signal can be supplied to the corresponding scan driving circuit portion 220 through the non-display area (NA) of the substrate 110 and the first and/or last flexible circuit film among the plurality of flexible circuit films 211.

The scan driving circuit portion 220 can be prepared in the non-display area (NA) of the substrate 110. The scan driving circuit portion 220 can generate a scan signal in accordance with the scan control signal provided from the display driving circuit portion 210, and can supply the scan signal to the corresponding scan line in accordance with a preset order. According to one embodiment of the present disclosure, the scan driving circuit portion 220 together with the thin film transistor can be formed in the non-display area (NA) of the substrate 110.

Figure 2:
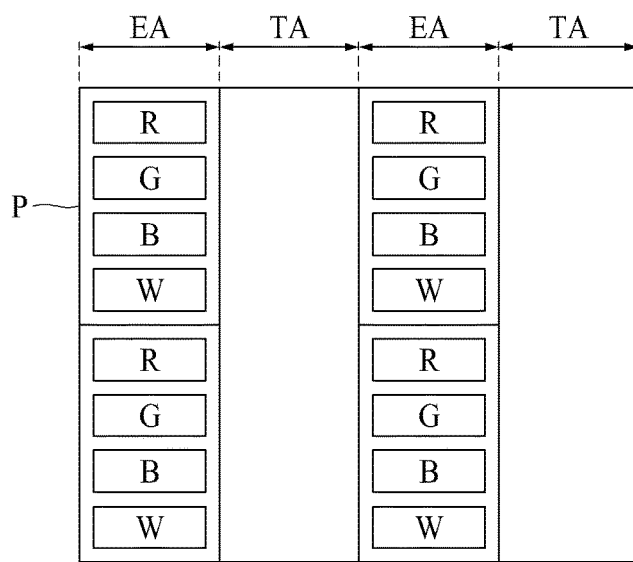
FIG. 2 is a plane view illustrating a pixel (P) of FIG. 1.

FIG. 2 is a plane view illustrating an example of the pixel (P) of FIG. 1.

Referring to FIG. 2, each pixel (P) of the transparent organic light emitting display apparatus according to one embodiment of the present disclosure can include a transmission area (TA) and an emission area (EA), or can include one or more TAs and one or more EAs. The transmission area (TA) corresponds to the area through which incident light passes intactly, and the emission area (EA) corresponds to the area configured to emit light. Thus, in case of the transparent organic light emitting display apparatus according to one embodiment of the present disclosure, an object or background positioned in its rear surface can be seen through the use of transmission areas (TA), and an image can be displayed through the use of emission areas (EA).

As shown in FIG. 2, multiple pixels (P) can also be provided in the emission area (EA). Each of the pixels (P) can include a red emitting portion (R), a green emitting portion (G), a blue emitting portion (G), and a white emitting portion (W), but the white emitting portion (W) can be omitted. Also, each of the pixels (P) can include at least two among a red emitting portion (R), a green emitting portion (G), a blue emitting portion (G), a yellow emitting portion, a magenta emitting portion, and a cyan emitting portion.

Accordingly, if the transparent organic light emitting display apparatus 100 is not driven, a user can watch the background, e.g., objects behind the rear of the display, through the transmission area (TA). If the transparent organic light emitting display apparatus 100 is driven, a user can watch both the displayed image through the emission area (EA) and the background through the transmission area (TA). In FIG. 2, a size ratio of the emission area (EA) to the transmission area (TA) is about 1:1, but is not limited to this ratio. A size ratio of the emission area (EA) to the transmission area (TA) can be preset in various types. According to one embodiment of the present disclosure, the transmission area (TA) can occupy 50% or more than 50% of one pixel in the transparent organic light emitting display apparatus.

Figure 3A:
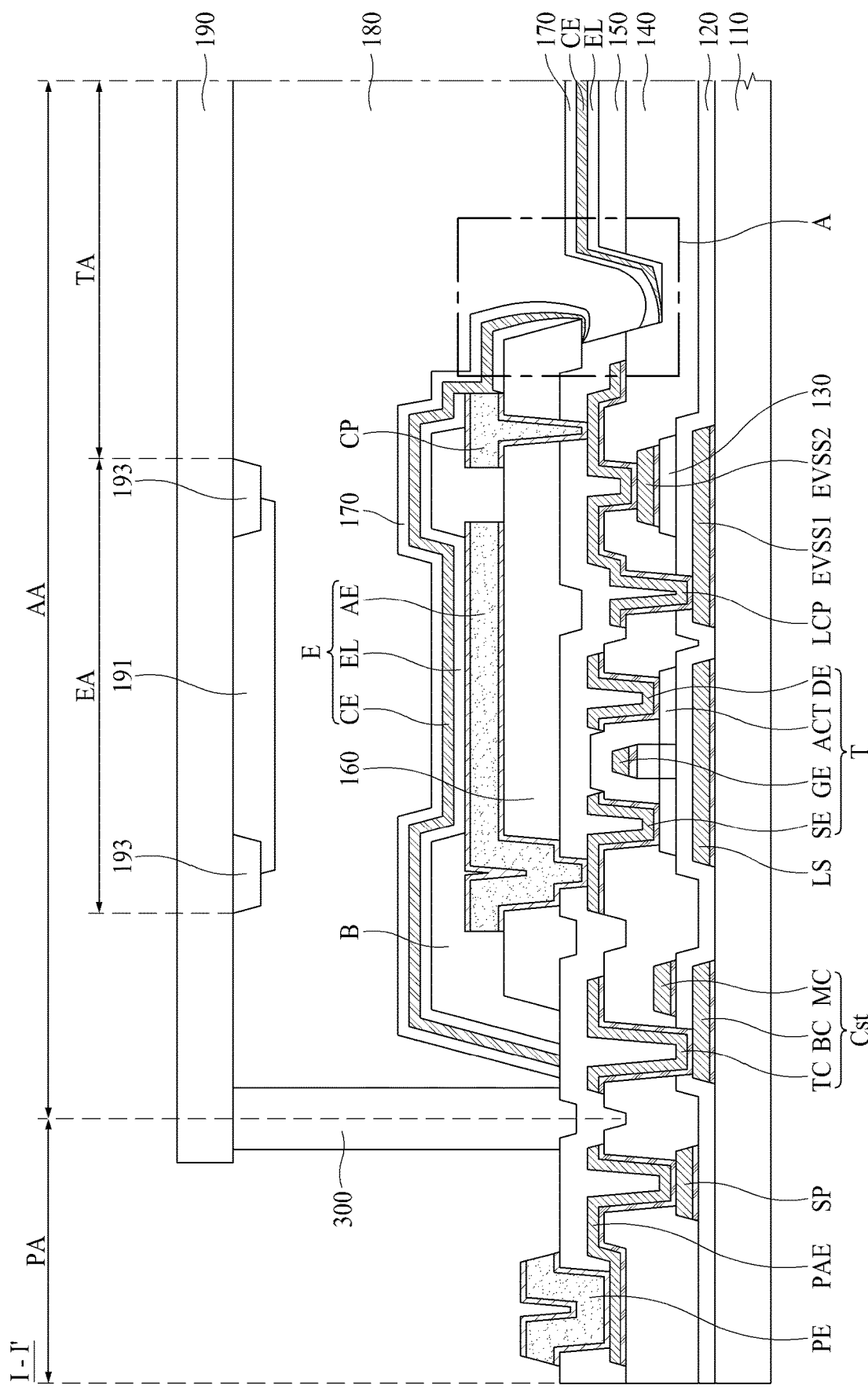
FIG. 3A is a cross sectional view along line I-I' of FIG. 1.
Figure 3B:
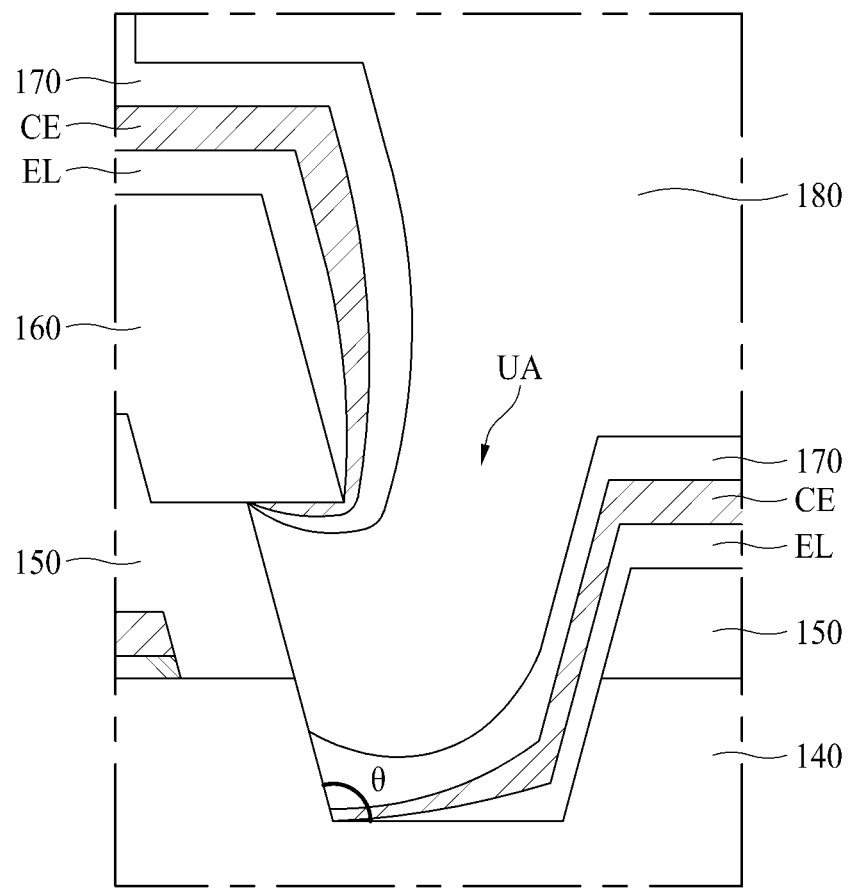
FIG. 3B is an expanded view illustrating "A" of FIG. 3A.

FIG. 3A is a cross sectional view along line I-I' of FIG. 1, and FIG. 3B is an expanded view illustrating "A" of FIG. 3A.

Referring to FIGS. 3A and 3B, the transparent organic light emitting display apparatus can include a first substrate (base substrate) 110, a light shielding layer (LS), a thin film transistor (T), a gate insulating film 130, an interlayer dielectric 140, a first protection layer 150, a planarization layer 160, an organic light emitting device (E), a bank (B), a second protection layer 170, an encapsulation layer 180, first and second auxiliary power lines (EVSS1, EVSS2), a line contact pattern (LCP), a contact pad (CP), a storage capacitor (Cst), a signal pad (SP), a pad auxiliary electrode (PAE), a pad electrode (PE), a color filter 191, a black matrix 193, a second substrate 190, and a dam 300.

The first substrate 110 is the base substrate, which can be a transparent flexible substrate capable of being bent, or a glass substrate. According to one embodiment of the present disclosure, the first substrate 110 can include a transparent polyimide material, but is not limited to this material. The first substrate 110 can be formed of a transparent plastic material such as polyethylene terephthalate. According to one embodiment of the present disclosure, the first substrate 110 can include a main component of silicon oxide ($SiO_2$) or aluminum oxide ($Al_2O_3$).

The light shielding layer (LS) can be disposed on the substrate 110 while being overlapped with the thin film transistor (T). For example, the light shielding layer (LS) can be obtained by depositing metal on the substrate 110 and carrying out an exposure patterning process to the metal deposited on the substrate 110.

The buffer layer 120 can be disposed on the substrate 110 and the light shielding layer (LS). According to one embodiment of the present disclosure, the buffer layer 120 can be formed by depositing a plurality of inorganic films. For example, the buffer layer 120 can be formed in a multi-layered structure obtained by depositing at least one of inorganic films, for example, silicon oxide film (SiOx), silicon nitride film (SiN), and silicon oxide nitride film (SiON). In order to prevent moisture from being permeated into the organic light emission device (E) through the substrate 110, the buffer layer 120 can be formed on an entire upper surface of the substrate 110.

The thin film transistor (T) can be disposed in each of the plurality of pixel areas on the buffer layer 120. According to one embodiment of the present disclosure, the thin film transistor (T) can include an active layer (ACT), a gate electrode (GE), a source electrode (SE), and a drain electrode (DE).

The active layer (ACT) can be prepared in the pixel area of the substrate 110. The active layer (ACT) can be overlapped with the gate electrode (GE), the source electrode (SE), and the drain electrode (DE), and the active layer (ACT) can include a channel region and source/drain regions, wherein the channel region can be formed in a central area of the active layer (ACT), and the source/drain regions can be disposed while being parallel to each other under the circumstances that the channel region is disposed in-between. Also, the gate insulating film 130 can be prepared on the active layer (ACT). In detail, the gate insulating film 130 can be disposed on the channel region of the active layer (ACT), and can be configured to insulate the active layer (ACT) and the gate electrode (GE) from each other, and the gate electrode (GE) can be prepared on the gate insulating film 130.

The interlayer dielectric 140 can be prepared on the gate electrode (GE). The interlayer dielectric 140 can protect the thin film transistor (T). In the interlayer dielectric 140, a corresponding partial portion configured to bring the active layer (ACT) into contact with the source electrode (SE) or drain electrode (DE) can be removed. For example, the interlayer dielectric 140 can include a first contact hole through which the source electrode (SE) penetrates, and a second contact hole through which the drain electrode (DE) penetrates. Also, the interlayer dielectric 140 can be formed on the buffer layer 120 of the transmission area (TA). According to one embodiment of the present disclosure, the interlayer dielectric 140 can include a silicon oxide film ($SiO_2$) or a silicon nitride film (SiN), or the interlayer dielectric 140 can be formed in a multi-layered structure comprising a silicon oxide film ($SiO_2$) and a silicon nitride film (SiN).

The first protection layer 150 can be prepared on the interlayer dielectric 140, the source electrode (SE), and the drain electrode (DE). The first protection layer 150 can protect the source electrode (SE) and the drain electrode (DE). The first protection layer 150 can include a third contact hole through which an anode electrode (AE) penetrates. Herein, the third contact hole of the first protection layer 150 can be connected with a fourth contact hole of the planarization layer 160, wherein the anode electrode (AE) penetrates through the fourth contact hole. Also, according to one embodiment of the present disclosure, the first protection layer 150 can include a silicon oxide film ($SiO_2$) or a silicon nitride film (SiN).

The planarization layer 160 is disposed on the substrate 110, and can be configured to cover the thin film transistor (T) disposed in each of the plurality of pixel areas. In detail, the planarization layer 160 is prepared on the thin film transistor (T), and can be configured to planarize an upper end of the thin film transistor (T). According to one embodiment of the present disclosure, the anode electrode (AE) and the contact pad (CP) can be prepared while being apart from each other in the upper end of the planarization layer 160. For example, the planarization layer 160 can include the fourth contact hole through which the anode electrode (AE) penetrates. Herein, the fourth contact hole of the planarization layer 160 can be connected with the third contact hole of the first protection layer 150, whereby the anode electrode (AE) penetrates therethrough. For example, the planarization layer 160 can include resin such as photo acryl and polyimide.

The transparent organic light emitting display apparatus 100 according to one embodiment of the present disclosure can include the emission area (EA), the transmission area (TA) which is disposed adjacent to the emission area (EA) and is configured to pass external light therethrough, and an undercut area (UA—FIG. 3B) formed in the transmission area (TA). The undercut area (UA) can be formed by filling the encapsulation layer 180, and can be defined by an overhanging portion of the planarization layer 160. The undercut area (UA) can be formed by etching all the first protection layer 150 and etching at least some of the interlayer dielectric 140 in "A" of FIG. 3A, whereby the undercut area (UA) can be defined as the area filled with the encapsulation layer 180.

Referring to FIGS. 3A and 3B, in one embodiment of the present disclosure, the undercut area (UA) can be formed by selectively etching the first protection layer 150 and the interlayer dielectric 140 of the transmission area (TA). According to one embodiment of the present disclosure, this selective etching can be carried out by a photolithography process of exposing a predetermined area including the undercut area (UA), and a following process of etching the first protection layer 150 and the interlayer dielectric 140 for the predetermined area including the undercut area (UA) exposed by the photolithography process.

The predetermined area including the undercut area (UA) exposed by photolithography can further include the planarization layer 160 which is overlapped with at least some of the undercut area (UA), and the planarization layer 160 can be formed in an upper portion of the undercut area (UA). Accordingly, the planarization layer 160 can include a predetermined protruding portion, and this protruding portion can be formed in the upper portion of the undercut area (UA). Also, this protruding portion is surrounded by a cathode electrode (CE) and the second protection layer 170 formed by the following process, and this protruding portion is combined with the undercut area (UA) after the process of filling the encapsulation layer 180, whereby it is possible to form a cross section of a hook structure capable of preventing the separation.

According to one embodiment of the present disclosure, a selective wet etching process can be carried out by the use of wet etchant capable of selectively etching only the interlayer dielectric 140 and the first protection layer 150 without etching the planarization layer 160. As described above, the planarization layer 160 include resin such as photo acryl and polyimide, and the interlayer dielectric 140 and the first protection layer 150 can be formed of a plurality of inorganic films including a silicon oxide film ($SiO_2$) or a silicon nitride film (SiN). According to one embodiment of the present disclosure, the interlayer dielectric 140 and the first protection layer 150 can be formed of a plurality of layers comprising a silicon oxide film ($SiO_2$).

Accordingly, the photolithography process is carried so as to expose only the predetermined area including the undercut area (UA). If the planarization layer is formed while being overlapped with at least some of the undercut area, for the following etching process, the overlapped planarization layer 160 is not etched, and the interlayer dielectric 140 and the first protection layer 150 disposed below the planarization layer 160 are etched so that it is possible to form the undercut area (UA). A sidewall of the interlayer dielectric 140 and the first protection layer 150 in the undercut area (UA) can have a predetermined taper angle (θ) above 90°.

In FIGS. 3A and 3B, the same taper angle (θ) is shown by the etching of the interlayer dielectric 140 and the first protection layer 150 in the undercut area (UA). However, if the interlayer dielectric 140 and the first protection layer 150 are formed of the different materials, or are deposited to have the different properties such as hardness, it is possible to form an etching profile with a step difference caused by the different taper angles and the different etching levels in accordance with the different etching speeds. This will be described later in detail with reference to FIGS. 4A to 4C.

The organic light emitting device (E) is disposed on the planarization layer 160 in the plurality of pixel areas, and can be electrically connected with the thin film transistor (T). The organic light emitting device (E) can include the anode electrode (AE), an emission layer (EL), and the cathode electrode (CE).

The anode electrode (AE) is prepared on the planarization layer 160 in the plurality of pixel areas, and can be electrically connected with the source electrode (SE) of the thin film transistor (T). The anode electrode (AE) can be in contact with the source electrode (SE) of the thin film transistor (T) through the fourth contact hole prepared in the planarization layer 160. The anode electrode (AE) can include a first anode electrode, a second anode electrode, and a third anode electrode.

The emission layer (EL) can be prepared on the anode electrode (AE) and the contact pad (CP). The emission layer (EL) can be formed for the entire pixel areas in common, however, the emission layer (EL) is not divided into each of the pixel areas. For example, the emission layer (EL) can include a hole transporting layer, an organic light emitting layer, and an electron transporting layer. According to one embodiment of the present disclosure, the emission layer (EL) can further include at least one functional layer so as to improve a light emission efficiency of the emission layer (EL) and to increase a lifespan of the emission layer (EL). And, the emission layer (EL) disposed on the contact pad (CP) can be removed for a cathode contact between the contact pad (CP) and the cathode electrode (CE).

The emission layer (EL) can be manufactured by a vacuum deposition process. In one embodiment of the present disclosure, if there is the structure of undercut area (UA) overlapped with at least some of the planarization layer 160, the emission layer (EL) has an inferior step coverage by the deposition process of the emission layer (EL). Thus, the emission layer (EL) can be not deposited in some portions of the undercut area (UA) overlapped with the planarization layer 160.

The cathode electrode (CE) can be prepared on the emission layer (EL). The cathode electrode (CE) can be formed as a common electrode type for all the pixel areas without being divided into each of the pixel areas. According to one embodiment of the present disclosure, the cathode electrode (CE) can be formed of transparent conductive oxide (TCO) such as Indium Tin Oxide (ITO) or Indium Zinc Oxide (IZO).

The cathode electrode (CE) has a superior step coverage by the deposition process. Thus, when the cathode electrode (CE) is deposited in the undercut area (UA), at least some of the cathode electrode (CE) can be deposited in some portions of the undercut area (UA) overlapped with the planarization layer 160, and can be deposited in a lower end portion of the planarization layer 160 overlapped with the undercut area (UA).

The bank (B) is disposed on the planarization layer 160 while being configured to divide the plurality of anode electrodes (AE) and the plurality of contact pads (CP). In detail, the bank (B) can electrically insulate the anode electrode (AE) from the contact pad (CP). The bank (B) can cover some of an upper portion of the contact pad (CP), and lateral surfaces and the remaining of the upper portion of the contact pad (CP) which are not covered by the bank (B) can be exposed to a cathode contact area.

And, the bank (B) can cover some portions of the anode electrode (AE). Thus, the bank (B) is disposed between the plurality of anode electrodes (AE) and the contact pad (CP), to thereby electrically insulate the contact pad (CP) from the adjacent anode electrodes (AE).

The second protection layer 170 can cover the display area (AA). In detail, the second protection layer 170 can be disposed on the organic light emitting device (E) of the emission area (EA).

According to one embodiment of the present disclosure, the second protection layer 170 can be coated onto the entire surface of the organic light emitting device (E), the contact pad (CP), and the first protection layer 150 by the deposition process. Herein, the second protection layer 170 can be formed by coating various materials by the deposition process, and can be stably deposited without regard to the material of each of the organic light emitting device (E), the contact pad (CP), and the first protection layer 150. According to one embodiment of the present disclosure, the second protection layer 170 can be formed in a multi-layered structure obtained by depositing one or more silicon oxide nitride films (SiON).

According to one embodiment of the present disclosure, the second protection layer 170 can be manufactured by a chemical vapor deposition (CVD) method. The second protection layer 170 has superior step coverage by the CVD method, whereby at least some of the second protection layer 170 can be deposited in the area of the undercut area (UA) overlapped with the planarization layer 160. However, the deposition method of the second protection layer 170 is not limited to the chemical vapor deposition (CVD) method. Any method having superior step coverage can be applied to the deposition method of the second protection layer 170.

The encapsulation layer 180 can cover the second protection layer 170 on the display area (AA). The encapsulation layer 180 prevents a permeation of external moisture, to thereby prevent the emission layer (EL) from being deteriorated. According to one embodiment of the present disclosure, the encapsulation layer 180 can be formed of at least one inorganic film and at least one organic film. The encapsulation layer 180 can be cured by a thermo-curing method or ultraviolet-curing method.

The encapsulation layer 180 can cover the entire surface of the second protection layer 170 on the display area (AA) and fills the undercut area UA. For example, the encapsulation layer 180 can be formed of a silicon oxide film ($SiO_2$), a silicon nitride film (SiN) or a silicon oxide nitride film (SiON), or can be formed in a multi-layered structure of inorganic films such as a silicon oxide film ($SiO_2$), a silicon nitride film (SiN) and a silicon oxide nitride film (SiON). As the encapsulation layer 180 covers the organic light emitting device (E) of the display area (AA), it is possible to prevent moisture or oxygen from being permeated into the organic light emitting device (E).

The undercut area (UA) can be filled with the encapsulation layer 180. In detail, the undercut area (UA), which is not fully filled with the aforementioned emission layer (EL), the cathode electrode (CE), and the second protection layer 170, can be filled with the encapsulation layer 180.

Referring to FIG. 3B, the encapsulation layer 180 filled in the undercut area (UA) has the cross sectional structure of a hook shape, whereby it is possible to provide the transparent organic light emitting display apparatus with the good delamination resistance to a specific layer comprising the emission layer (EL) by a physical deformation such as an external shock and bending force.

In the transparent organic light emitting display apparatus 100 according to one embodiment of the present disclosure, the encapsulation layer 180 filled in the undercut area (UA) has the cross sectional structure of the hook shape. Thus, if the physical deformation occurs in the display apparatus 100 by the external shock or bending force, the delamination is not generated by adhesion strength in the interface between the encapsulation layer 180 and the second protection layer 170 disposed below the encapsulation layer 180 or between the encapsulation layer 180 and the second substrate 190 disposed above the encapsulation layer 180. However, only when a force capable of separating the encapsulation layer 180 having the hook structure filled in the undercut area (UA) from the undercut area (UA) is applied, the delamination may occur. Thus, the transparent organic light emitting display apparatus includes the encapsulation layer 180 filled in the undercut area (UA) and configured to have a structure preventing or minimizing a separation by the physical deformation due to, e.g., external shock and bending force, to thereby realize the good bending durability.

Also, the undercut area (UA) can be provided at the position being adjacent to the emission area (EA), and can be disposed at both sides of the emission area (EA). Thus, the encapsulation layer 180 having the hook structure filled in the undercut area (UA) can function as one kind of protection layer improving the resistance to the physical deformation associated with external shock and bending force to be applied to the organic light emitting device (E) comprising the emission layer (EL) which is vulnerable to the delamination.

A second auxiliary power line (EVSS2) is electrically connected with a line contact pattern (LCP), is disposed in the same layer as that of the gate electrode (GE), and is formed of the same material as that of the gate electrode (GE). In detail, the second auxiliary power line (EVSS2) can be disposed on the gate insulating film 130.

A first auxiliary power line (EVSS1) is electrically connected with the line contact pattern (LCP), is disposed in the same layer as that of the light shielding layer (LS), and is formed of the same material as that of the light shielding layer (LS). In detail, the first auxiliary power line (EVSS1) can be disposed on the substrate 110.

The line contact pattern (LCP) can be disposed on the interlayer dielectric 140 while being apart from the source electrode (SE) and the drain electrode (DE). And, the line contact pattern (LCP) can be electrically connected with the contact pad (CP) through the contact hole prepared in the planarization layer 160. The line contact pattern (LCP) can include a lower line contact pattern and an upper line contact pattern.

The contact pad (CP) can be disposed on the planarization layer 160 in the plurality of pixel areas, and can be electrically connected with the line contact pattern (LCP). The contact pad (CP) can be electrically connected with the line contact pattern (LCP) through the contact hole prepared in the planarization layer 160 and the first protection layer 150. The contact pad (CP) can include a first metal film, a second metal film, and a third metal film.

The signal pad (SP) can be formed on the buffer layer 120. For example, the signal pad (SP) can be formed of the same material as that of the gate electrode (GE), and can be disposed in the same layer as that of the gate electrode (GE).

The pad auxiliary electrode (PAE) can be prepared on the interlayer dielectric 140. For example, the pad auxiliary electrode (PAE) can be in contact with the signal pad (SP) through the contact hole prepared in the interlayer dielectric 140, and can be in contact with the pad electrode (PE) through the contact hole prepared in the first protection layer 150. The pad auxiliary electrode (PAE) can include a lower pad auxiliary electrode and an upper pad auxiliary electrode.

The pad electrode (PE) can be formed on the first protection layer 150. For example, the pad electrode (PE) can be in contact with the pad auxiliary electrode (PAE) through the contact hole prepared in the first protection layer 150. The pad electrode (PE) can include a first pad electrode, a second pad electrode, and a third pad electrode.

The storage capacitor (Cst) can include a lower capacitor electrode (BC), a middle capacitor electrode (MC), and an upper capacitor electrode (TC).

The second substrate 190 can be formed on the upper surface of the encapsulation layer 180. The second substrate 190 can be an encapsulation substrate. The second substrate 190 can include a plastic film, a glass substrate, or an encapsulation film. On the lower surface of the second substrate 190, there are a color filter layer 191 and a black matrix 193. The black matrix 193 can be patterned to define the pixel area. The color filter layer 191 can be formed in the pixel area defined by the black matrix 193. The color filter layer 191 can include a red (R) color filter, a green (G) color filter, and a blue (B) color filter patterned by each pixel.

The dam 300 is formed between the first substrate 110 and the second substrate 190 while being disposed in the periphery of the display area (AA), wherein the dam 300 can be provided to enhance adhesion strength between the second substrate 190 and the encapsulation layer 180, and to prevent a moisture permeation. The dam 300 can be formed in the boundary area between the display area (AA) and the pad area (PA). The dam 300 can include sealant, and moisture-absorbing filler dispersed in the sealant. The sealant can be thermo-curing sealant or photo-curing sealant.

Figure 4A:
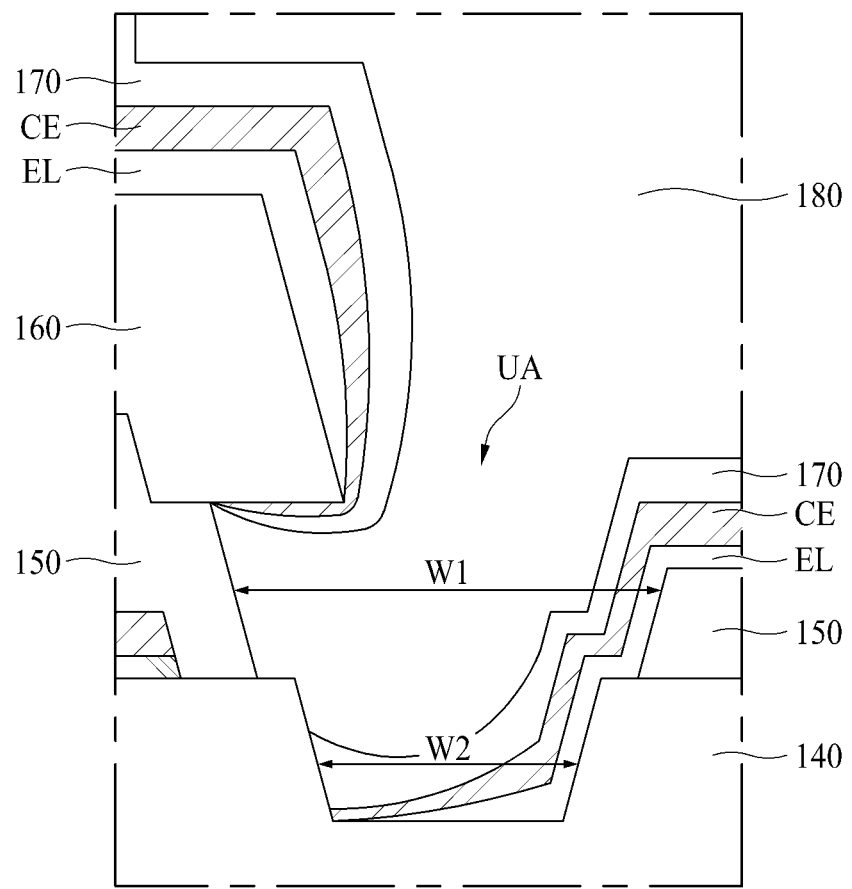
FIGS. 4A to 4C are cross sectional views illustrating examples of a structure of an undercut area (UA) in a transparent organic light emitting display apparatus according to one embodiment of the present disclosure.
Figure 4B:
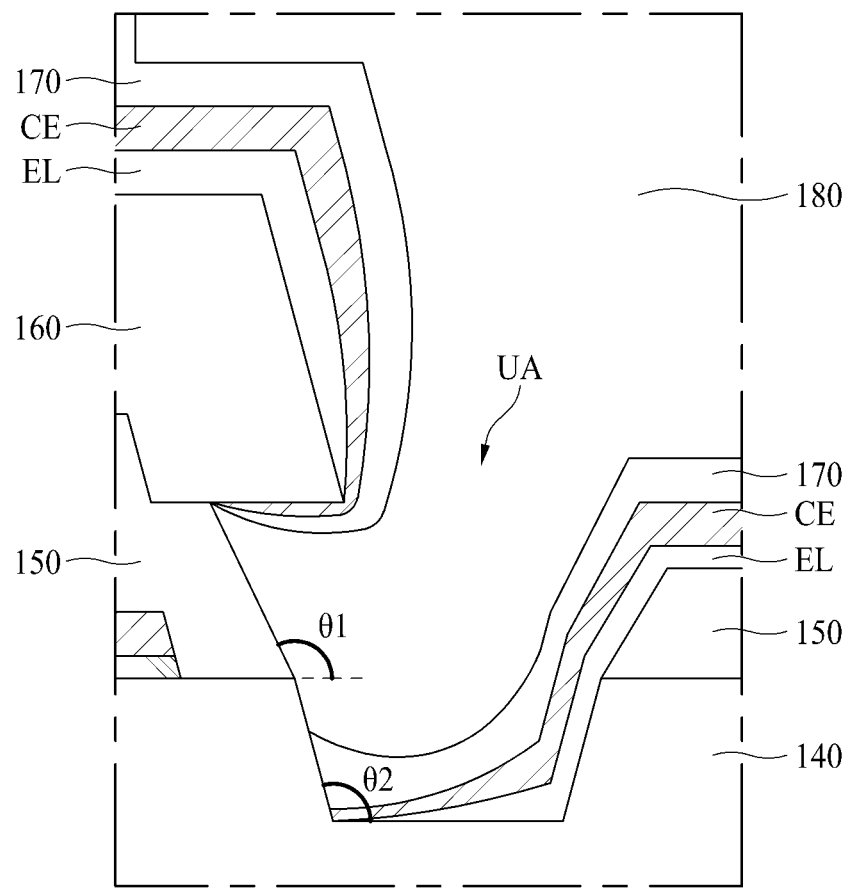
Figure 4C:
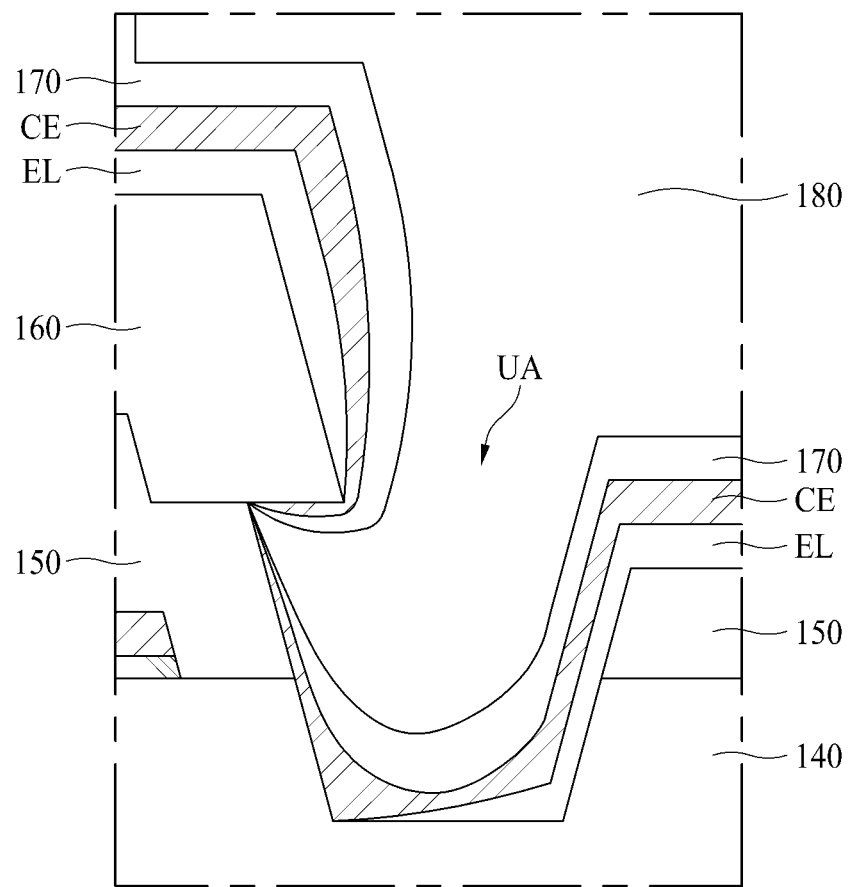

FIGS. 4A to 4C are cross sectional views illustrating examples of the structure of the undercut area (UA) in the transparent organic light emitting display apparatus according to one embodiment of the present disclosure.

Referring to an example of FIG. 4A, the selective etching profile of the interlayer dielectric 140 and the first protection layer 150 in the undercut area (UA) has the step coverage with the step shape. According to one embodiment of the present disclosure, the selective etching profile having the above shape can be generated when an etching rate of the first protection layer 150 to a wet etchant used for the wet etching process is higher than an etching rate of the interlayer dielectric 140. Accordingly, a width (W1) by the etching of the first protection layer 150 in the undercut area (UA) can be larger than a width (W2) by the etching of the interlayer dielectric 140 in the undercut area (UA).

If the selective etching profile of the interlayer dielectric 140 and the first protection layer 150 has the step shape in the undercut area (UA), the etched width (W1) of the first protection layer 150 in the undercut area (UA) is larger than the etched width (W2) of the interlayer dielectric 140 in the undercut area (UA), whereby the encapsulation layer 180 filled in the undercut area (UA) extends more toward the planarization layer 160.

In this case, the etched width (W1) of the first protection layer 150 in the undercut area (UA), and the etched width (W2) of the interlayer dielectric 140 in the undercut area (UA) can be defined as the etch width measured in the middle of the etch depth.

Referring to another example of FIG. 4B, the first protection layer 150 in the undercut area (UA) is etched in the taper angle (inclined angle) θ1, and the interlayer dielectric 140 in the undercut area (UA) is etched in the taper angle θ2. For example, both angles θ1 and θ2 may be greater than 90 degrees. According to one embodiment of the present disclosure, the selective etching profile having the above shape can be generated when the interlayer dielectric 140 and the first protection layer 150 are formed of the same material and are manufactured under the same process conditions. For example, if the interlayer dielectric 140 and the first protection layer 150 are formed of silicon oxide films (SiO$_2$), and a process temperature of the first protection layer 150 is relatively lower than a process temperature of the interlayer dielectric 140, the first protection layer 150 and the interlayer dielectric 140 can have the different properties. Accordingly, an etching rate of the first protection layer 150 can be relatively higher than an etching rate of the interlayer dielectric 140. Also, if the interlayer dielectric 140 and the first protection layer 150 are formed of the same material, the step difference may be not generated in the interface between the interlayer dielectric 140 and the first protection layer 150, but is not limited to this structure. The predetermined step difference can be generated in the interface between the interlayer dielectric 140 and the first protection layer 150.

As described in FIGS. 4A and 4B, if the step different is generated by the relatively-large etched width (W1) of the interlayer dielectric 140 in the undercut area (UA) in comparison to the etched width (W2) of the first protection layer 150 in the undercut area (UA), or the etching taper angle (θ1) of the first protection layer 150 in the undercut area (UA) is larger than the etching taper angle (θ2) of the interlayer dielectric 140 in the undercut area (UA), the undercut area (UA) overlapped with the planarization layer 160 extends more toward the planarization layer 160 or the emission area (EA), whereby the encapsulation layer 180 having the hook shape filled in the undercut area (UA) can have a structure that can minimize or prevent separation from the undercut area (UA).

Referring to another example of FIG. 4C, the cathode electrode (CE) and the second protection layer 170 are formed on the sidewall of the area overlapped with the planarization layer of the undercut area (UA).

Referring to FIG. 4C in connection with FIG. 3B, the case of FIG. 3B shows that the cathode electrode (CE) and the second protection layer 170 are not deposited in the undercut area (UA) overlapped with the planarization layer 160. For example, in FIG. 4C, the cathode electrode (CE) and the second protection layer 170 cover the entire sidewalls of the UA directly under the planarization layer 160. As a result, the sidewalls and the bottom surface of the UA may be covered by the CE and the second protection layer 170. The difference of deposition profile between FIG. 4C and FIG. 3B can be generated by the change of deposition process conditions such as the process pressure or source supply amount. According to one embodiment of the present disclosure, the structure of FIG. 4C can have the superior step coverage by carrying out the deposition process of the cathode electrode (CE) and the second protection layer 170 under the preset process conditions of the relatively low pressure and relatively low source supply amount. The structure of FIG. 3B can be obtained by carrying out the deposition process of the cathode electrode (CE) and the second protection layer 170 under the preset process conditions of the relatively higher pressure and relatively higher source supply amount in comparison to the process conditions of FIG. 4C.

Also, the profile of the lateral surface portion and the lower end portion in which the interlayer dielectric 140 and the first protection layer 150 of the undercut area (UA) are etched is formed in a linear shape, but is not limited to this shape. The profile of the lateral surface portion and the lower end portion in which the interlayer dielectric 140 and the first protection layer 150 of the undercut area (UA) are etched can be formed in a predetermined streamlined shape.

Figure 5A:
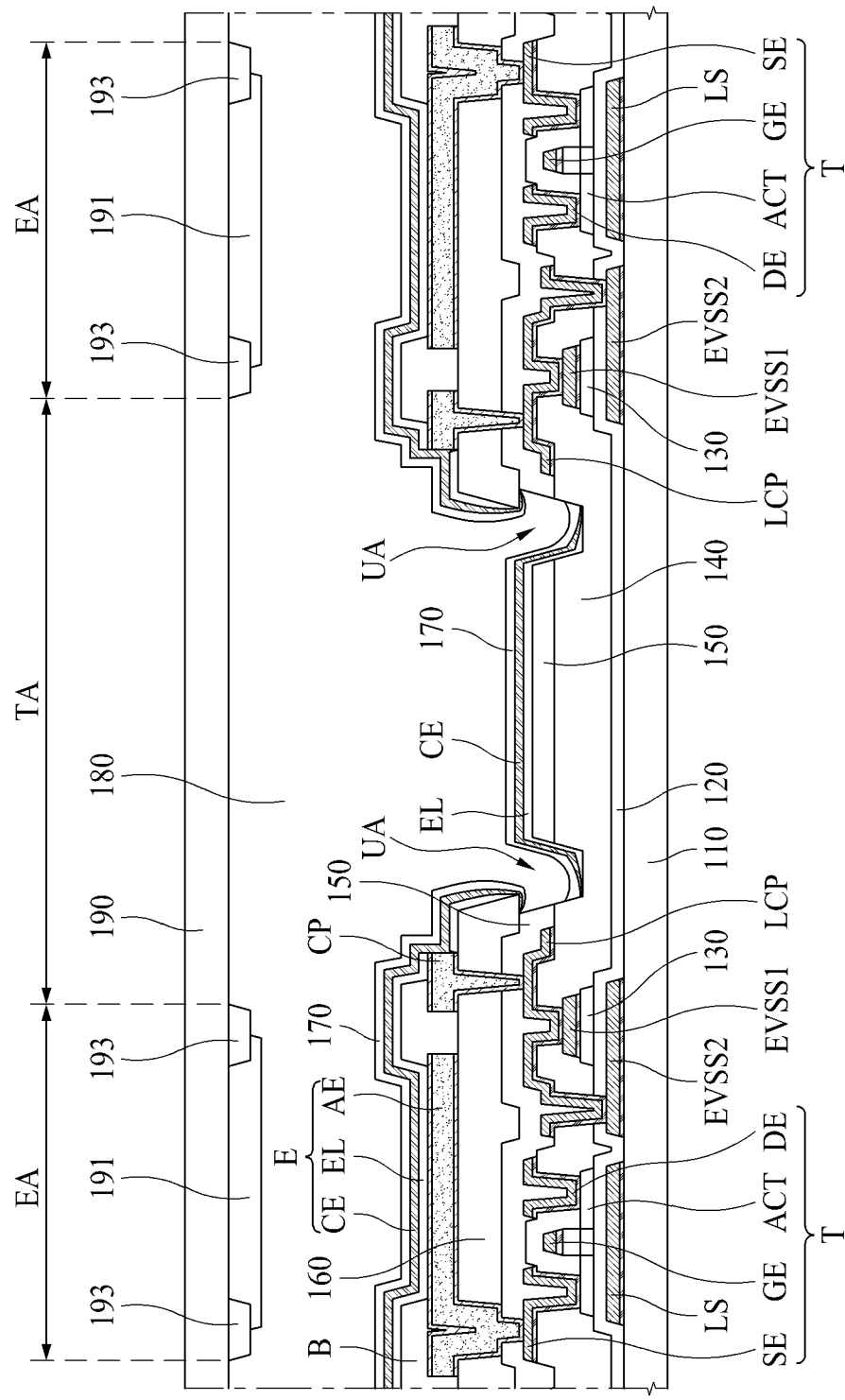
FIG. 5A is a cross sectional view illustrating two emission areas and a transmission area between the emission areas in a transparent organic light emitting display apparatus according to one embodiment of the present disclosure.
Figure 5B:
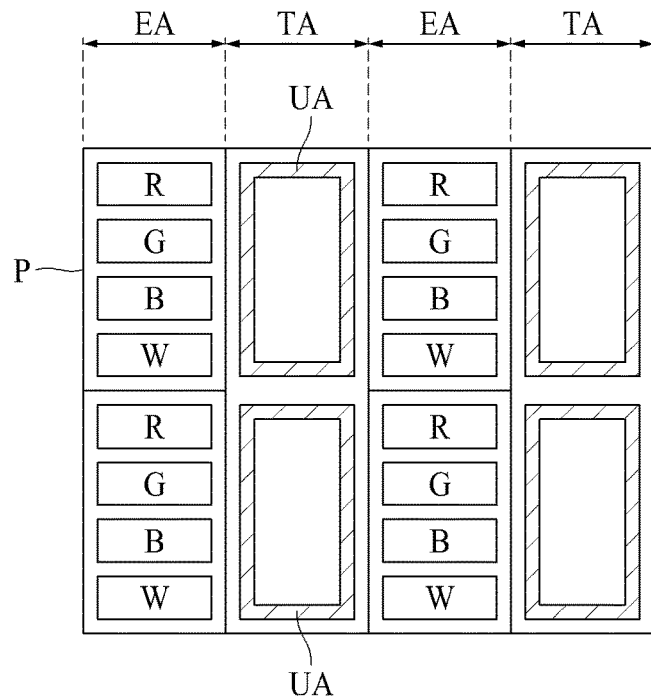
FIGS. 5B to 5D are plane views illustrating different examples of an undercut area (UA) in a transparent organic light emitting display apparatus according to one embodiment of the present disclosure.
Figure 5C:
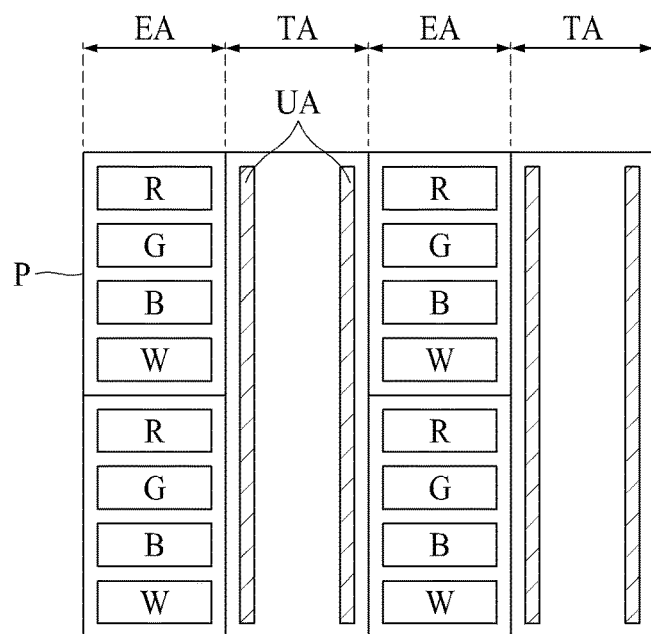
Figure 5D:
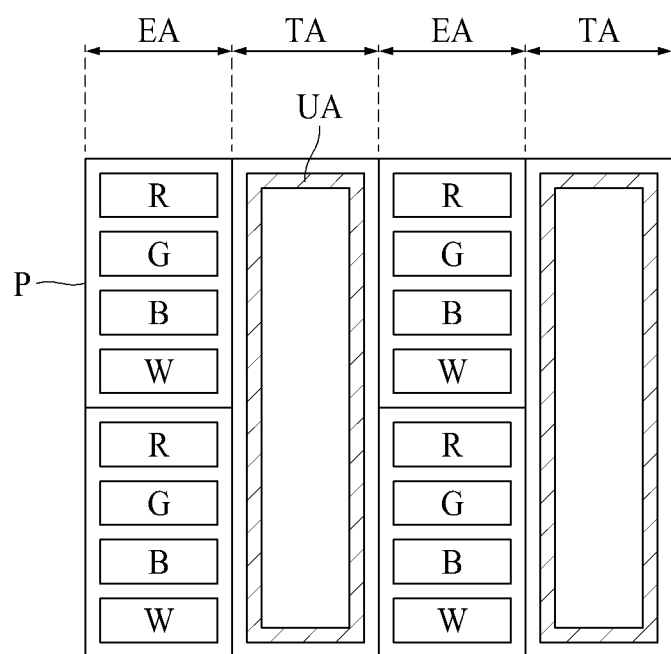

FIG. 5A is a cross sectional view illustrating an example of two emission areas and a transmission area between the two emission areas in the transparent organic light emitting display apparatus according to one embodiment of the present disclosure, and FIGS. 5B to 5D are plane views illustrating various example of the undercut area (UA) of the transparent organic light emitting display apparatus according to one embodiment of the present disclosure. The same or similar elements of FIG. 3A are shown and used in FIG. 5A.

Referring to FIG. 5A, one or more undercut areas (UA) can be formed in the transmission area (TA) of the transparent organic light emitting display apparatus according to one embodiment of the present disclosure, and the encapsulation layer 180 of the hook shape can be formed in the undercut area(s) (UA). Thus, even though the external shock is applied, or the physical deformation such as the bending force is generated, it is possible to realize the improved stable structure of the transparent organic light emitting display apparatus 100 without the delamination of the specific layer comprising the emission layer (EL).

FIGS. 5B to 5D are plane views illustrating various examples of the undercut area (UA) of the transparent organic light emitting display apparatus according to one embodiment of the present disclosure.

Referring to a first example of FIG. 5B, the undercut area (UA) can be configured to have a closed-loop structure in the transmission area (TA). According to one embodiment of the present disclosure, the undercut area (UA) has the closed-loop structure, and the undercut area (UA) can be overlapped with or correspond to unit pixel. In FIG. 5B, the undercut area (UA) is formed in each of all the unit pixels, but not necessarily. The undercut area (UA) can be provided in accordance with requirements for the bending properties of the transparent organic light emitting display apparatus 100. For example, the undercut area (UA) can be formed only in 50% of all the pixels.

Referring to FIG. 5D, the undercut area (UA) can have the closed-loop structure in the transmission area (TA), and can be overlapped with the plurality of pixels. In FIG. 5D, the undercut area (UA) of the closed-loop structure can be formed in the transmission area (TA) corresponding to the two pixels, but is not limited to this structure. The size of the undercut area (UA) can vary in accordance with requirements for the bending properties of the transparent organic light emitting display apparatus 100.

Referring to FIG. 5C, the undercut area (UA) is not limited to the closed-loop structure in the transmission area (TA), and the undercut area (UA) can be formed as at least one line pattern in the transmission area (TA). For example, the undercut area (UA) can be selectively formed only in the left and right sides of the transmission area (TA) being adjacent to the emission area (EA), e.g., in the shape of two separate lines.

As described in FIGS. 5A to 5D, the undercut area (UA) (e.g., in the closed-loop structure or line patterns) can disposed in the left and right sides of the emission area (EA), whereby the encapsulation layer 180 (e.g., having the hook structure) filled in the undercut area (UA) can be provided to surround the both sides of the emission area (EA). Accordingly, the encapsulation layer 180 (e.g., having the hook structure) filled in the undercut area (UA) can function as one kind of protection layer capable of improving the resistance to the physical deformation such as the external shock or bending force to be applied to the organic light emitting device (E) comprising the emission layer (EL) which is vulnerable to the delamination.

Figure 6:
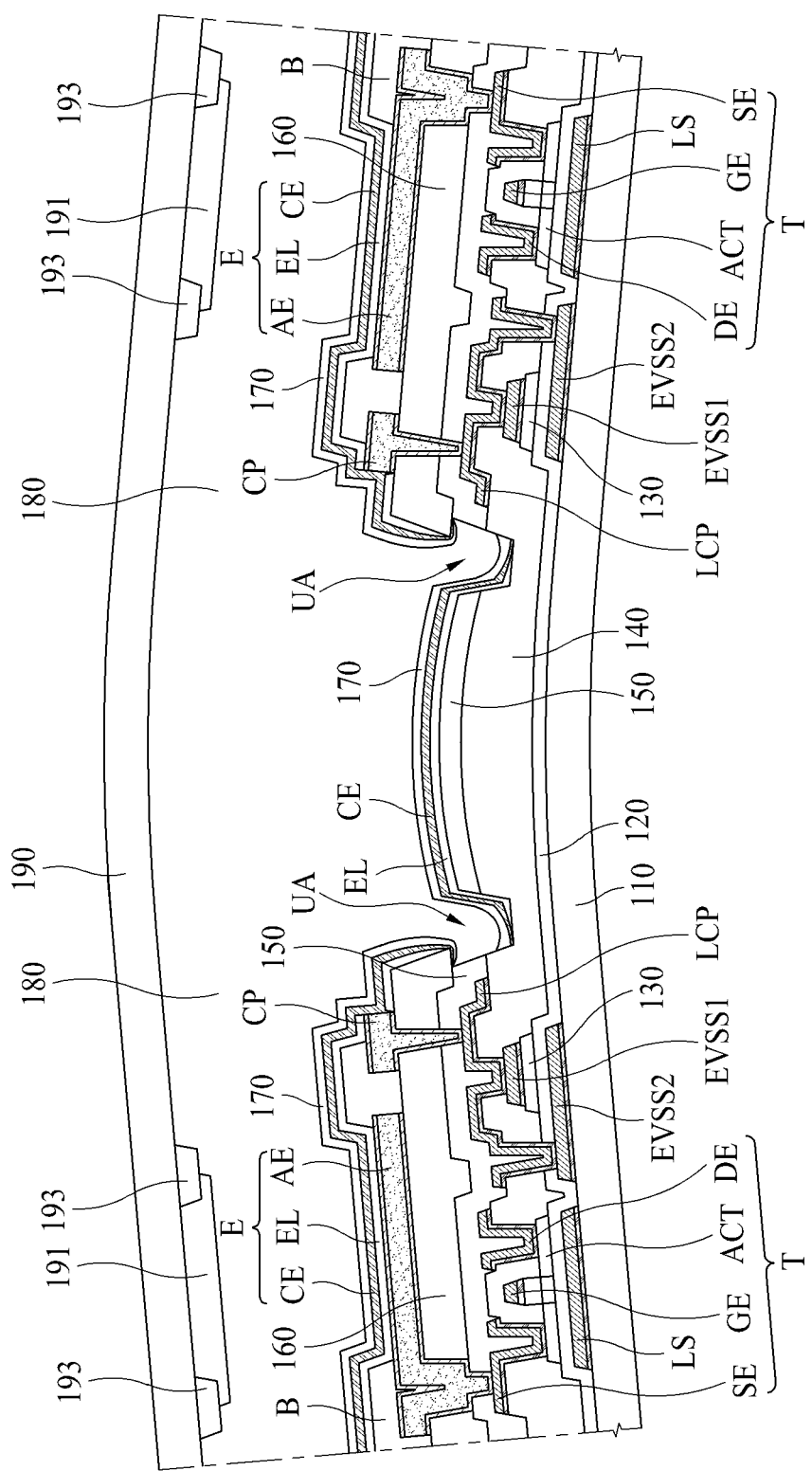
FIG. 6 is a cross sectional view illustrating a case of bending a transparent organic light emitting display apparatus according to one embodiment of the present disclosure.

FIG. 6 is a cross sectional view illustrating the bending state of the transparent organic light emitting display apparatus according to one embodiment of the present disclosure, and FIG. 6 shows that the transparent organic light emitting display apparatus according to one embodiment of the present disclosure is bent at a predetermined angle toward a first direction with respect to the transmission area (TA).

Referring to FIG. 6, the transparent organic light emitting display apparatus 100 according to one embodiment of the present disclosure includes the undercut area (UA) formed in the transmission area (TA), and the undercut area (UA) can be formed at the side adjacent to the emission area (EA). The undercut area (UA) can be overlapped with at least some of the planarization layer 160, and the undercut area (UA) can be the area formed by selectively etching at least some portions of the interlayer dielectric and the first protection layer in the transmission area (TA). Accordingly, the encapsulation layer 180 filled in the undercut area (UA) can have the hook-shaped structure so that it is possible to prevent the lower and upper structures of the encapsulation layer 180 from being delaminated by the deformation such as the bending state. Also, although not shown, even though the transparent organic light emitting display apparatus 100 according to one embodiment of the present disclosure is bent in the opposite direction to the bending direction shown in FIG. 6, the encapsulation layer 180 formed in the undercut area (UA) can have the same effect as the aforementioned effect.

FIGS. 7A to 7G are cross sectional views illustrating a method for manufacturing the display apparatus according to one embodiment of the present disclosure, which relates to the method for manufacturing the transparent organic light emitting display apparatus shown in FIG. 3A. Thus, the same reference numbers will be used throughout the drawings to refer to the same or like parts, and a repetitive explanation for the same parts related with each material and structure will be omitted or may be brief.

Figure 7A:
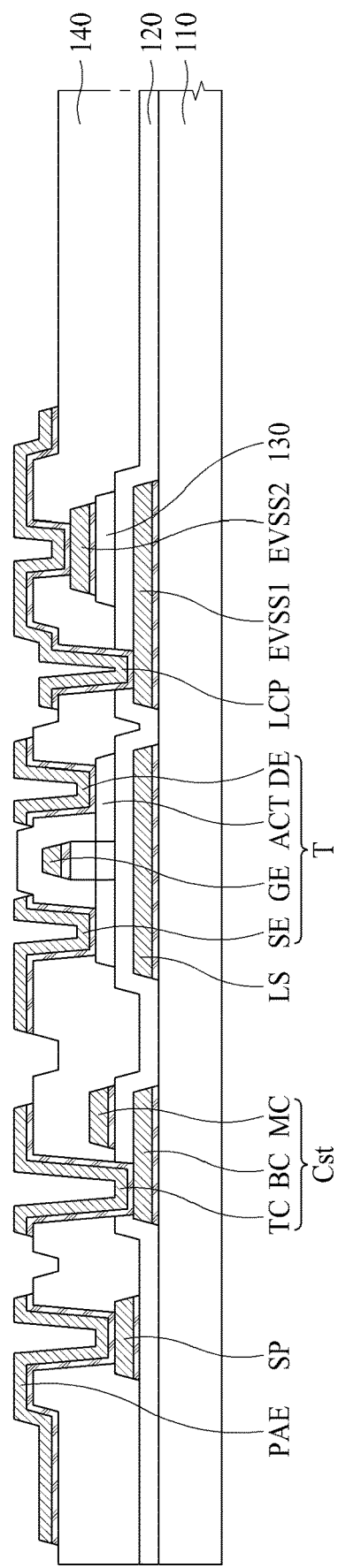
FIGS. 7A to 7G are cross sectional views illustrating a method of manufacturing a transparent organic light emitting display apparatus according to one embodiment of the present disclosure, which correspond to cross sectional views along I-I' of FIG. 3A.

In FIG. 7A, various elements and layers including the thin film transistor (T), the first and second auxiliary power lines (EVSS1, EVSS2), the line contact pattern (LCP), the storage capacitor (Cst), the signal pad (SP), the pad auxiliary electrode (PAE), the light shielding layer (LS), the gate insulating film 130, and the interlayer dielectric 140 are provided on the substrate 110.

Figure 7B:
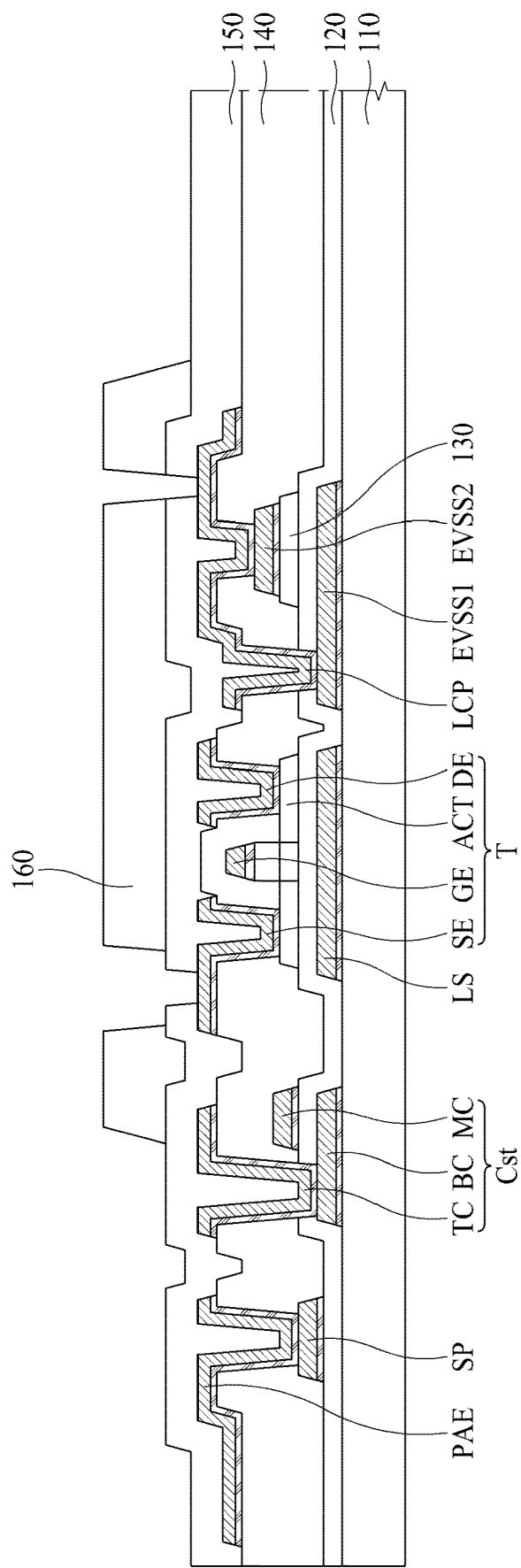

In FIG. 7B, the first protection layer 150 is disposed over the interlayer dielectric 140, and the planarization layer 160 can be patterned on the first protection layer 150. The planarization layer 160 can be patterned on the display area (AA), and more particularly, on the area corresponding to the emission area (EA). Also, the planarization layer 160 can be patterned while protruding toward the transmission area (TA) so as to be overlapped with at least some of the transmission area (TA).

Also, the planarization layer 160 can include the contact hole configured to electrically connect the anode electrode (AE) and the contact pad (CP) formed for the following process with the source electrode (SE) and the line contact pattern (LCP) formed therebelow.

Figure 7C:
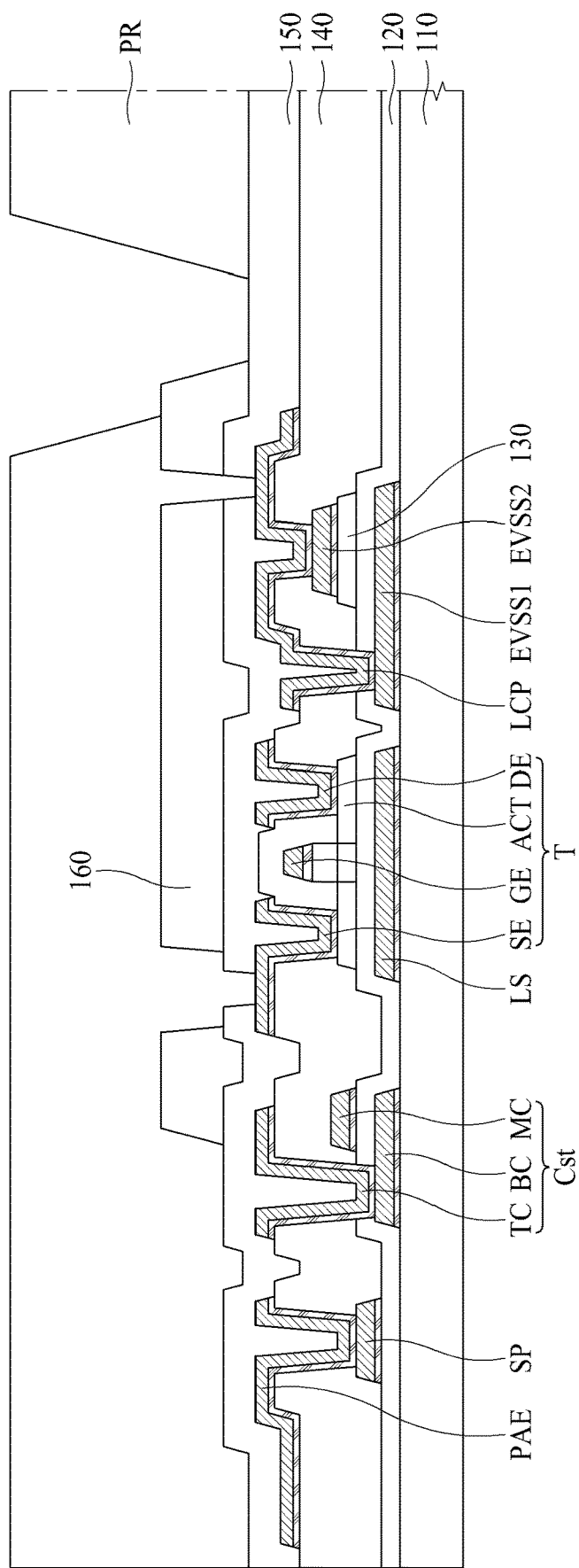

Then, as shown in FIG. 7C, after forming the planarization layer 160, photoresist (PR) can be formed in the predetermined area corresponding to the undercut area (UA) by the photolithography process. The predetermined area corresponding to the undercut area (UA) can be overlapped with at least some of the planarization layer 160 formed by the prior process.

Figure 7D:
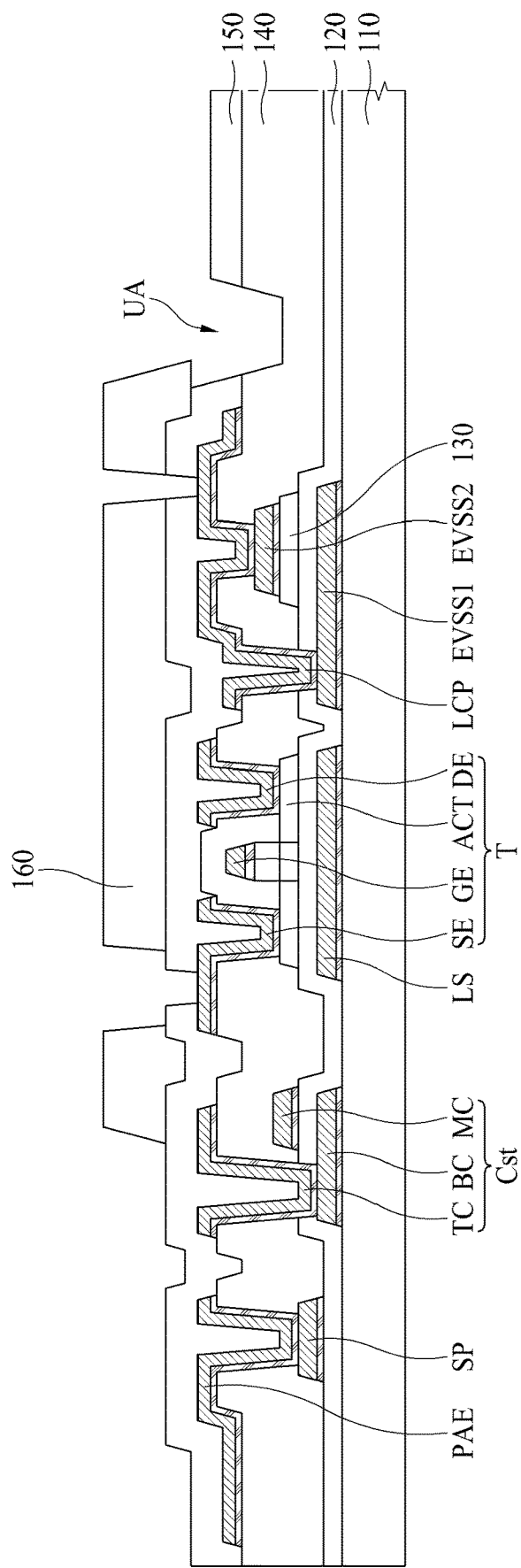

Then, FIG. 7D shows that the undercut area (UA) is formed by etching the interlayer dielectric 140 and the first protection layer 150 in the area exposed by removing the photoresist of FIG. 7C.

Referring to FIG. 7D, all the first protection layer 150 corresponding to the undercut area (UA) is etched, and some of the interlayer dielectric 140 is etched. The formation of the undercut area (UA) can be carried out by the wet etching process using the wet etchant, wherein the wet etchant is capable of selectively etching only the interlayer dielectric 140 and the first protection layer 150 without etching the planarization layer 160.

As the undercut area (UA) is formed by the wet etching process, the first protection layer 150 and the interlayer dielectric 140 which remain in the undercut area (UA) for the prior process can be etched. In detail, the etching process is performed only in the uppermost end of the first protection layer 150 exposed by photoresist, and the etched area can radiate isotropically without the etching directivity.

Also, FIG. 7D shows that the taper angle by the etching is identical. However, if the interlayer dielectric 140 and the first protection layer 150 are formed of the different materials, or are deposited to have the different properties such as hardness, the etching profile with the step difference can be formed by the different taper angles and the different etching levels in accordance with the different etching speeds.

Figure 7E:
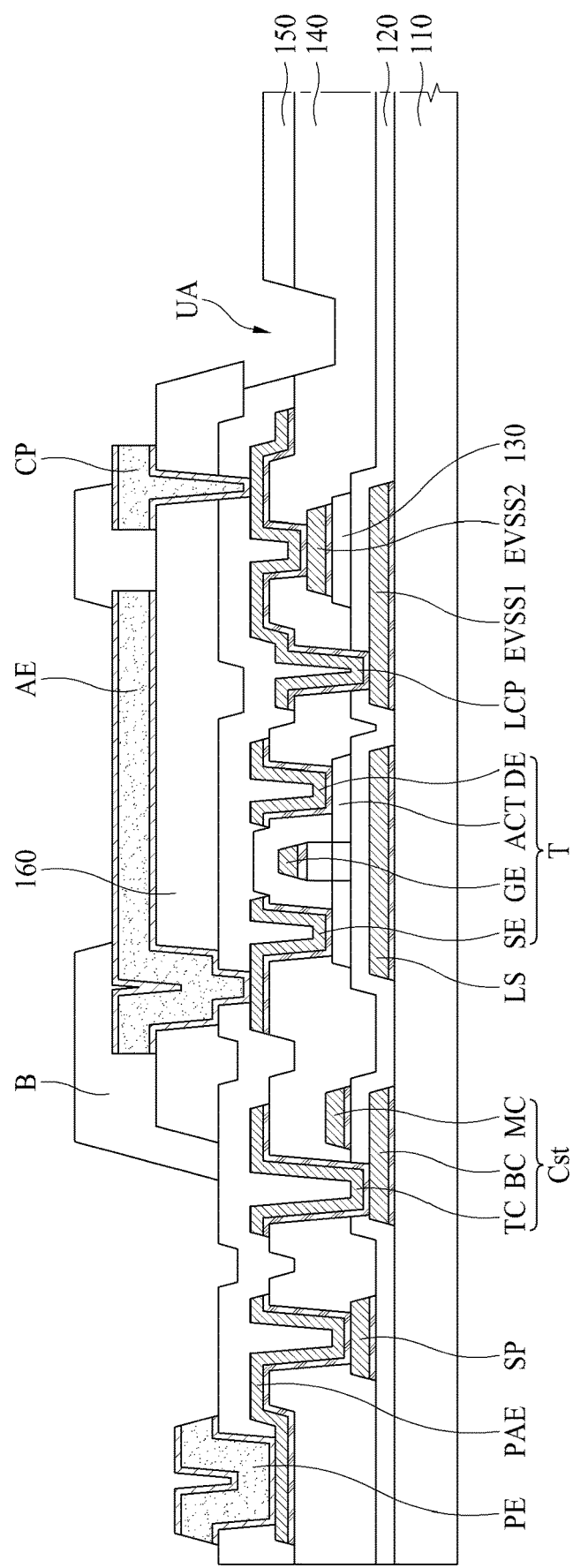

Then, as shown in FIG. 7E, after the anode electrode (AE) and the contact pad (CP) are patterned, the bank (B) can be overlapped with the anode electrode (AE) and the contact pad (CP).

Figure 7F:
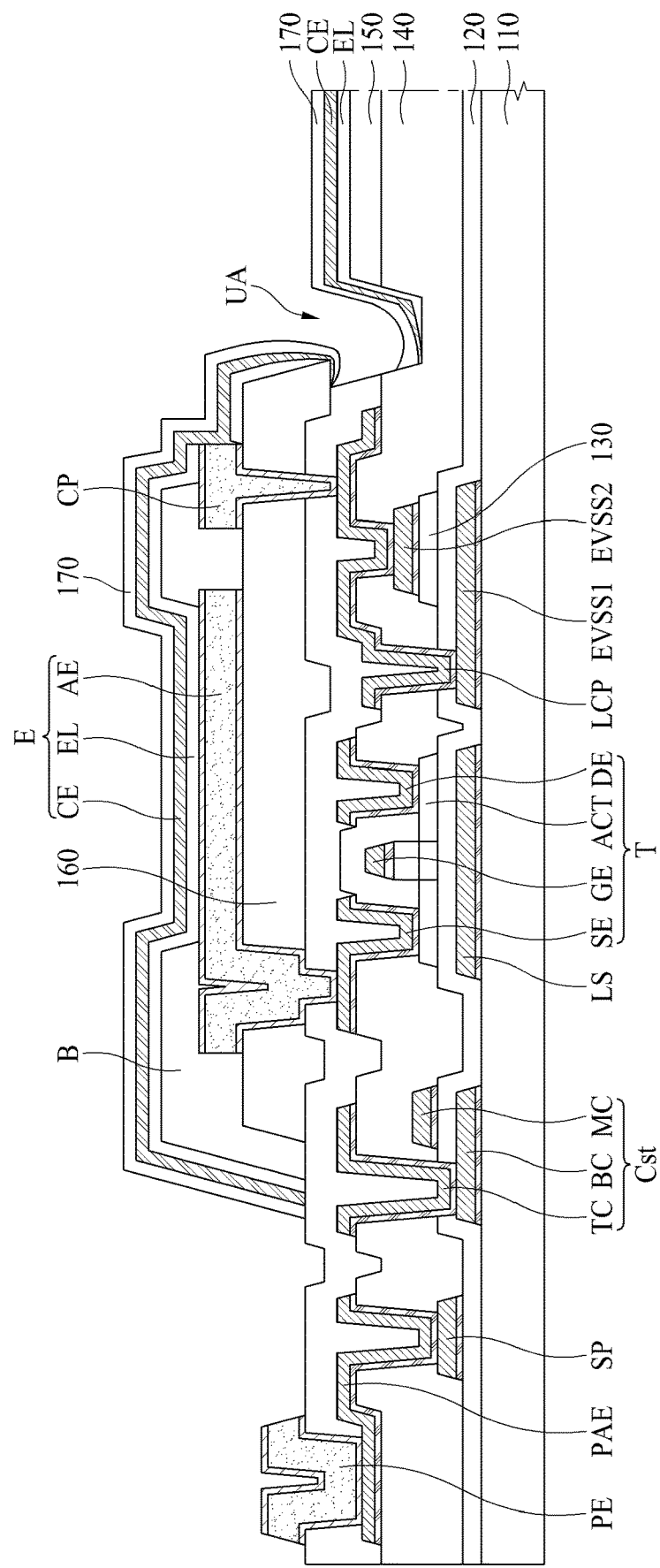

Then, as shown in FIG. 7F, the emission layer (EL), the cathode electrode (CE), and the second protection layer 170 can be sequentially deposited. The step coverage by the deposition process of the emission layer (EL) may be inferior, whereby the emission layer (EL) may not be deposited in the area of the undercut area (UA) overlapped with the planarization layer 160. Then, the cathode electrode (CE) has the superior step coverage by the deposition process, whereby the cathode electrode (CE) can cover all the lateral surface and lower end portion of the trench formed by the undercut area (UA), and the planarization layer 160 can be deposited in the lower end portion of the planarization layer 160 overlapped with the undercut area (UA). Then, the second protection layer 170 can be manufactured by the CVD process, and the cathode electrode (CE) has the superior step coverage by the CVD process, whereby the second protection layer 170 can cover all the lateral surface and lower end portion of the trench formed by the undercut area (UA), and can cover the cathode electrode (CE) previously deposited in the prior process, and the second protection layer 170 can be deposited in the lower end portion of the planarization layer 160 overlapped with the undercut area (UA).

Figure 7G:
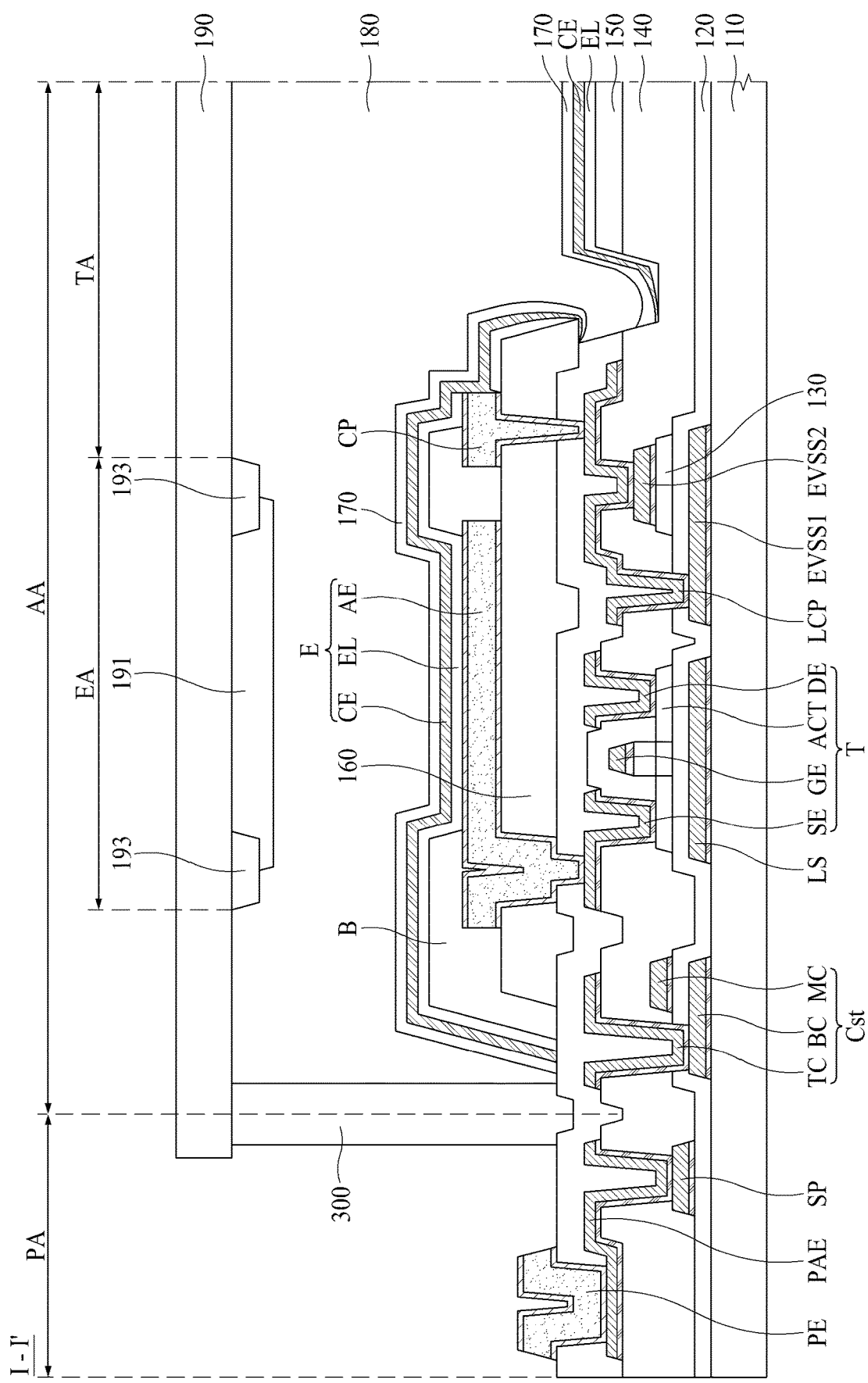

Then, as shown in FIG. 7G, the emission layer (EL), the cathode electrode (CE), and the second protection layer 170 can be deposited in some area of the undercut area (UA) by the deposition process, and the encapsulation layer 180 can be deposited in the remaining area of the undercut area (UA). Then, in the following process, the second substrate 190 comprising the color filter layer 191 and the black matrix 193 can be formed on the encapsulation layer 180.

The transparent organic light emitting display apparatus according to the present disclosure can be described as follows.

According to an embodiment of the present disclosure, a transparent organic light emitting display apparatus comprises an emission area, a transmission area disposed adjacent to the emission area and configured to pass external light, and an undercut area formed in the transmission area, wherein the undercut area is formed by filling an encapsulation layer.

According to one or more embodiments of the present disclosure, the transparent organic light emitting display apparatus can further include a planarization layer overlapped with at least some portions of the undercut area.

According to one or more embodiments of the present disclosure, the undercut area can be formed as at least one line pattern in the transmission area.

According to one or more embodiments of the present disclosure, the undercut area can be configured to have a closed-loop structure in the transmission area.

According to one or more embodiments of the present disclosure, the undercut area can be overlapped with or correspond to a plurality of pixels.

According to one or more embodiments of the present disclosure, the undercut area can be overlapped with or correspond to a unit pixel.

According to one or more embodiments of the present disclosure, the transmission area can include a first substrate, an interlayer dielectric disposed over the first substrate, a first protection layer disposed over the interlayer dielectric, and an encapsulation layer disposed over the first protection layer.

According to one or more embodiments of the present disclosure, the undercut area can be formed by selectively etching at least some portions of the interlayer dielectric and the first protection layer.

According to one or more embodiments of the present disclosure, the transmission area can further include an emission layer, a cathode electrode, and a second protection layer whose at least some portions are formed between the interlayer dielectric and the encapsulation layer.

According to one or more embodiments of the present disclosure, a taper angle of the first protection layer in the undercut area can be larger than a taper angle of the interlayer dielectric in the undercut area.

According to one or more embodiments of the present disclosure, a width of the first protection layer in the undercut area can be larger than a width of the interlayer dielectric in the undercut area.

According to the embodiment of the present disclosure, a method of manufacturing a transparent organic light emitting display apparatus having an emission area, and a transmission area disposed adjacent to the emission area and configured to pass external light therethrough, comprises sequentially forming an interlayer dielectric and a first protection layer on a first substrate, patterning a planarization layer on the first protection layer, forming an organic light emitting device on the planarization layer, and forming an encapsulation layer and an encapsulation substrate on the organic light emitting device, wherein a step of exposing and etching at least some portions of the transmission area by photolithography is carried out after the step of patterning the planarization layer.

According to one or more embodiments of the present disclosure, in the step/process of exposing at least some portions of the transmission area by photolithography after the step of patterning the planarization layer, the exposed area can be partially overlapped with the planarization layer.

According to one or more embodiments of the present disclosure, in the step/process of exposing and etching at least some portions of the transmission area by photolithography after the step of patterning the planarization layer, the etching step can be carried out by a wet etching process.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method of manufacturing a transparent organic light emitting display apparatus having an emission area, and a transmission area disposed adjacent to the emission area and configured to pass external light therethrough, the method comprising:
sequentially forming an interlayer dielectric layer and a first protection layer on a first substrate;
patterning a planarization layer over the first protection layer;
forming an organic light emitting device over the planarization layer; and
forming an encapsulation layer and an encapsulation substrate over the organic light emitting device,
the method further comprising exposing and etching at least some portions of the transmission area by using photolithography after the patterning of the planarization layer,
wherein the transmission area includes:
the planarization layer covering a thin film transistor of the emission area, and including an overhanging portion,
the interlayer dielectric layer disposed below the planarization layer,
the encapsulation layer disposed on the planarization layer, and
an undercut area disposed below the overhanging portion of the planarization layer, and filled by the encapsulation layer.

2. The method of manufacturing a transparent organic light emitting display apparatus according to claim 1, wherein, in the exposing the at least some portions of the transmission area by using the photolithography, the exposed portions are partially overlapped with the planarization layer.

3. The method of manufacturing a transparent organic light emitting display apparatus according to claim 1, wherein the etching the at least some portions of the transmission area is carried out by a wet etching process.

4. The method of manufacturing a transparent organic light emitting display apparatus according to claim 1, wherein the interlayer dielectric layer includes an indented area corresponding to a portion of the undercut area.

5. The method of manufacturing a transparent organic light emitting display apparatus according to claim 4, wherein a taper angle of the indented area of the interlayer dielectric layer in the undercut area is greater than 90 degrees.

6. The method of manufacturing a transparent organic light emitting display apparatus according to claim 1, wherein the transmission area further includes:
the first protection layer disposed between the planarization layer and the interlayer dielectric layer, and including a thru hole corresponding to the undercut area,
wherein the encapsulation layer fills the thru hole of the first protection layer in the undercut area.

7. The method of manufacturing a transparent organic light emitting display apparatus according to claim 6, wherein a taper angle of an indented area of the interlayer dielectric layer in the undercut area is greater than 90 degrees, and a taper angle of the first protection layer in the undercut area is greater than 90 degrees.

8. The method of manufacturing a transparent organic light emitting display apparatus according to claim 7, wherein the taper angle of the first protection layer in the undercut area is larger than the taper angle of the interlayer dielectric layer in the undercut area.

9. The method of manufacturing a transparent organic light emitting display apparatus according to claim 6, wherein a width of the thru hole of the first protection layer in the undercut area is larger than a width of an indented area the interlayer dielectric layer in the undercut area.

10. The method of manufacturing a transparent organic light emitting display apparatus according to claim 1, wherein the transmission area further includes an emission layer, a cathode electrode, and a second protection layer all covering the overhanging portion of the planarization layer.

11. The method of manufacturing a transparent organic light emitting display apparatus according to claim 10, wherein the emission layer, the cathode electrode and the second protection layer are disposed on a bottom surface of the undercut area.

12. The method of manufacturing a transparent organic light emitting display apparatus according to claim 11, wherein the cathode electrode and the second protection layer are disposed on a side surface of the undercut area below the overhanging portion of the planarization layer.

13. The method of manufacturing a transparent organic light emitting display apparatus according to claim 1, wherein the transmission area includes a plurality of the undercut areas, and is bendable.

14. The method of manufacturing a transparent organic light emitting display apparatus according to claim 1, wherein the undercut area is formed to have at least one line pattern in the transmission area.

15. The method of manufacturing a transparent organic light emitting display apparatus according to claim 14, wherein the at least one line pattern of the undercut area corresponds to one pixel.

16. The method of manufacturing a transparent organic light emitting display apparatus according to claim 14, wherein the at least one line pattern of the undercut area corresponds to multiple pixels.

17. The method of manufacturing a transparent organic light emitting display apparatus according to claim 1, wherein the undercut area has a closed-loop structure in the transmission area.

18. The method of manufacturing a transparent organic light emitting display apparatus according to claim 17, wherein the closed-loop structure of the undercut area corresponds to one pixel.

19. The method of manufacturing a transparent organic light emitting display apparatus according to claim 17, wherein the closed-loop structure of the undercut area corresponds to multiple pixels.

* * * * *